United States Patent [19]

Deverall et al.

[11] Patent Number: 5,451,823
[45] Date of Patent: Sep. 19, 1995

[54] VEHICULAR THERMOCONDUCTIVE LEAD FRAME RECTIFIER ASSEMBLY

[75] Inventors: Robert M. Deverall, Apopka, Fla.; Nicholas F. DeNardis, Marshfield, Wis.; Michael C. Simmons, Winter Park, Fla.

[73] Assignee: Transpo Electronics, Inc., Orlando, Fla.

[21] Appl. No.: 16,504

[22] Filed: Feb. 11, 1993

[51] Int. Cl.⁶ .................. H02K 11/00; H02M 1/00
[52] U.S. Cl. .................... 310/68 D; 310/71; 363/145
[58] Field of Search ............ 310/68 D, 68 R, 71, 310/42, 43; 363/126, 141, 145

[56] References Cited

U.S. PATENT DOCUMENTS

| | | | |
|---|---|---|---|
| 3,629,631 | 12/1971 | Cotton et al. | 310/68 D |
| 3,641,374 | 2/1972 | Sato | 310/68 D |
| 3,812,390 | 5/1974 | Richards | 310/68 D |
| 3,927,338 | 12/1975 | Vieilleribiere | 310/68 D |
| 3,959,676 | 5/1976 | Striker | 310/68 D |
| 4,189,653 | 2/1980 | Hiratuka et al. | 310/68 D |
| 4,419,597 | 12/1983 | Shiga et al. | 310/68 D |
| 4,604,538 | 8/1986 | Merrill et al. | 310/68 D |
| 4,606,000 | 8/1986 | Steele et al. | 363/145 |
| 5,043,614 | 8/1991 | Yockey | 310/68 D |
| 5,233,246 | 8/1993 | Yockey | 310/71 |

Primary Examiner—Kristine L. Peckman
Assistant Examiner—D. R. Haszko

[57] ABSTRACT

A bridge rectifier assembly includes: a self aligning cloverleaf shaped diode header which sandwiches each diode chip; a semi-circular heat and electrically conductive plate accommodated with receptacles to position the cloverleaf diodes; a heat and non-electrical conductive insulator; a finned heat and electrical conductive extrusion with similar receptacles to position the cloverleaf diodes; an articulated terminal to provide thermal and mechanical stress relief executing an electrode function adhered to the cloverleaf diode header; and a molded insulated integument with embedded electrical conductors of a cantilevered configuration to further alleviate thermodynamic and mechanical stresses. A second embodiment repeats the first embodiment, and includes a heat and electrical conductive plate that is larger in area and with the extrusion succeeded by a second plate of identical outline as the first.

21 Claims, 12 Drawing Sheets

VEHICULAR THERMOCONDUCTIVE LEAD FRAME RECTIFIER ASSEMBLY

BACKGROUND OF THE INVENTION

This invention is directed to constructions for rectifier assemblies for engine-driven alternating current generators that can be manually assembled in either a semi-automatic manufacturing operation with minimum error and a high degree of precision, thereby reducing the manufacturing cost of the rectifier assembly.

In U.S. Pat. No. 4,606,000, Steele et al. presents a method of embedding preformed leads in a wedge block configuration that is inserted in a dovetail receptacle extruded into an aluminum cooling member. The preformed leads are manufactured of a soft metal that is easily deformed in physical shape by ordinary handling. Precautionary steps must be taken to assure the integrity of the preferred configuration when using Steele's technique. Moreover, when using the Steele et al. technique, the diode chip is sandwiched between two larger header plates of square geometry, requiring additional steps to accomplish the centering requirement. The Steele et al. technique also requires extraneous means to position the diode-header assemblies on the essentially flat surfaces of the cooling-conductive members.

In the prior art, the cooling of the insulated cooling member in a rectifier assembly has been largely dependent on convection or forced air cooling. This method of cooling is adequate, provided that the ventilation apertures are kept clean and free of any debris or foreign matter. However, in practice, an adhering film is often deposited on the cooling members and within the walls of the ventilating apertures from emitted engine lubricants. This film attracts and holds botanical debris, insects and other undesirable matter. Moreover, on forced cooling rectifier assemblies using a cooling medium, the greatly attenuated rate of heat exchange due to aperture blockage results in excessive heat build-up in the thermo generating diodes, which shortens the life expectancy of the diodes and leads to premature failure.

SUMMARY OF THE INVENTION

In this invention, preformed leads are cast directly into an integument that is so fashioned to prevent alteration of key alignment points in a manner consistent with normal handling. The preformed leads are cast in such a manner whereby their electric contact point is permitted to flex to ease mechanical and thermal stress to the diodes to which they are connected.

In a specific form, the present invention also provides a diode header which, in a preferred form, is similar in shape to a four leaf clover, with the innermost dimensions of the header corresponding with the outermost dimensions of the diode chip. In this manner, the header can be dropped into a simple four sided tapered fixture followed by the diode chip and then the second header, which will rest in near perfect alignment. Cavities are pressed into the diode assembly locations as part of the overall stamping process to provide precise diode alignment.

The second embodiment of this invention is a rectifier assembly which shifts the burden of heat removal from the insulated cooling member from forced cooling medium convection to thermo-conductivity. The shifting of the burden of heat removal is implemented by first maximizing the area of the generator endplate which directly contacts the cooling member. In a specific form, the increase of area is approximately 23%. A plate type cooling member is used, and has a peripheral outline similar to the direct contacting cooling member with the second cooling member placed in-line and parallel to the direct cooling member. The two cooling members are electrically insulated from each other by a highly heat conductive silicon insulating material coated on each side with a thermal conductive compound. Each cooling member is fabricated with ventilating apertures geometrically similar and concentric to existing ventilating apertures pre-existing in the parent generator end frame. By comparison, the combined total area of the plate cooling member is nearly twice that of the slotted area in the extruded cooling member. Furthermore, the average area of each end frame image is approximately eight times greater than the area of each slot, in order to greatly lessen the possibly of aperture blockage.

This second embodiment of this invention keeps the first and second cooling members at nearly the same temperature, the temperature being nearly equal to the temperature of the end frame. The additional cooling medium flow due to the end frame image apertures further reduces the temperature rise of the cooling members. A side-effect advantage is correspondingly gained as the isolated cooling member resides in the shadow of the direct or grounded cooling member as viewed from the rear of the end frame. The possibility of a battery to ground short is greatly alleviated due to an inadvertent slip of a metal tool.

In summary, from the accompanying drawing and the detailed description set out below, it will be appreciated by those skilled in the art as to how: a diode header is shaped so that it can be dropped into a mating fixture for alignment; preformed leads can be molded into an integument to provide mechanical and thermal stress relief; the preformed leads can be structured to provide a conductivity path in a compact manner; the preformed leads can be structured to provide a conductivity path from one external circuit element to a second external circuit element; cooling member indentations can be used to align the diode assemblies and component terminals in a specific and beneficial way; direct and indirect cooling members can be assembled in a quick and precise way; a rectifier assembly can be made to shift the burden of heat dissipation from convection cooling, which is subject to blockage resulting in permanent failure, to a more reliable thermo-conductive method which is not victimized by coolant flow blockage; a rectifier assembly can be made to be less subject to coolant flow blockage; and a rectifier assembly can be made to rectify a greater quantity of current with respect to prior art rectifier assemblies in a similarly sized package.

BRIEF DESCRIPTION OF THE DRAWINGS

In the Drawing, FIGS. 1-9, inclusive, illustrate a first embodiment and FIGS. 10-15 illustrate a second embodiment.

FIGS. 1a1 to 1a6 are views of the integral preformed leads integument assembly of FIG. 1.

FIGS. 1b1 to 1b3 are views of the extruded isolated cooling member of FIG. 1.

FIGS. 1d and 1d1 to 1d3 are views of the direct contacting cooling member of FIG. 1.

FIGS. 10a1 to 10a6 are views of the integral preformed leads integument assembly of FIG. 10.

FIGS. 10b1 to 10b3 are views of the isolated cooling member of FIG. 10.

FIGS. 10d and 10d1 to 10d3 are views of the direct contacting cooling member of FIG. 10.

DESCRIPTION OF THE INVENTION

Figure 1:
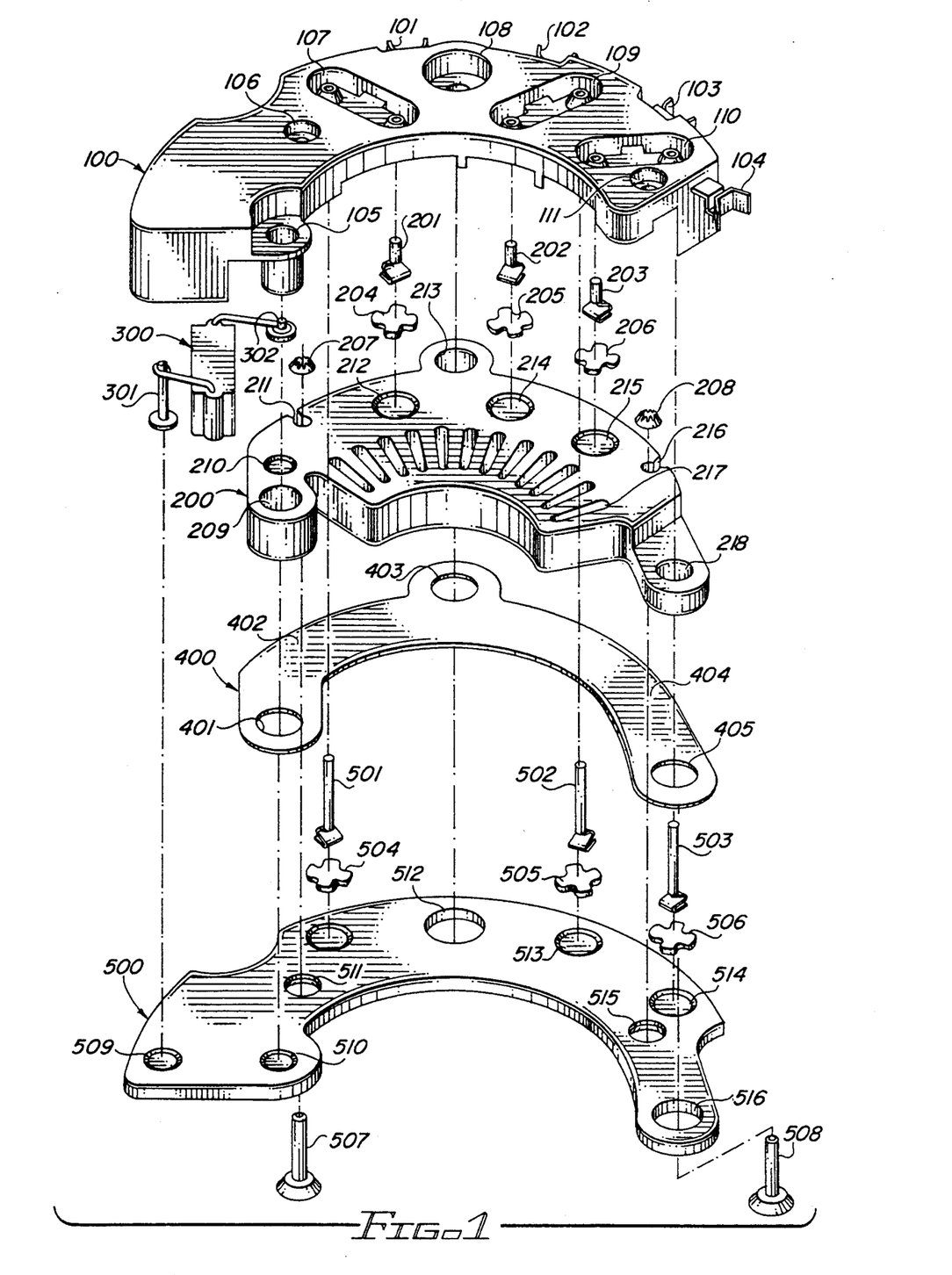
FIG. 1 is an exploded three-dimensional view depicting each of the components constituting the rectifier assembly of the first embodiment.
Figure 1A:
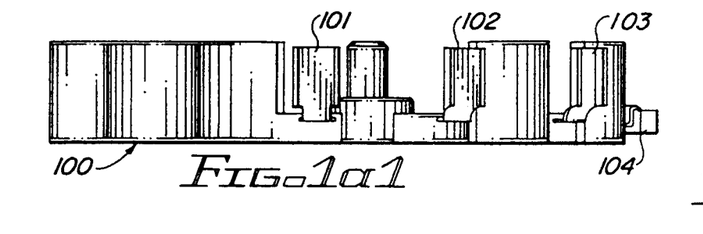
Figure 1A:
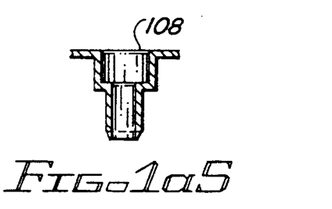
Figure 1A:
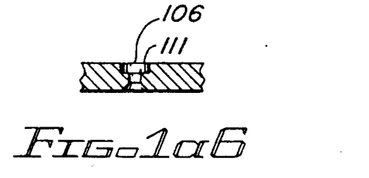
Figure 1A:
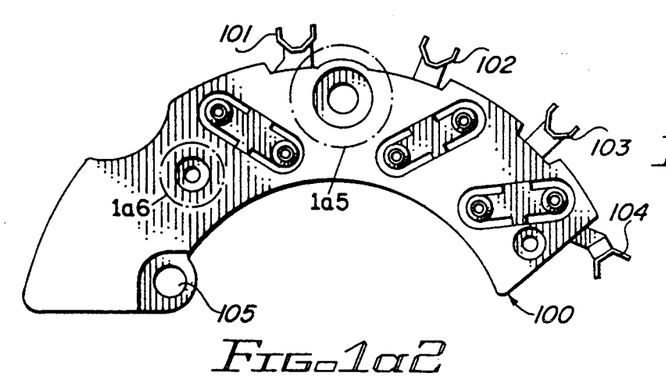
Figures 1A, 1A:
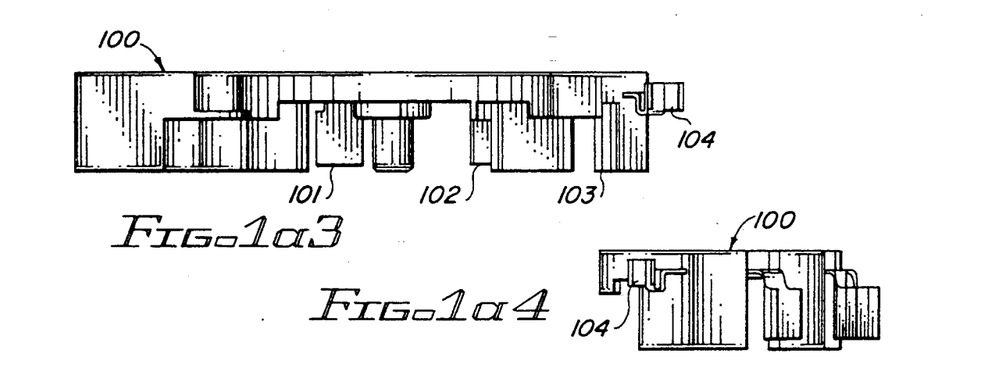
Figure 1B:
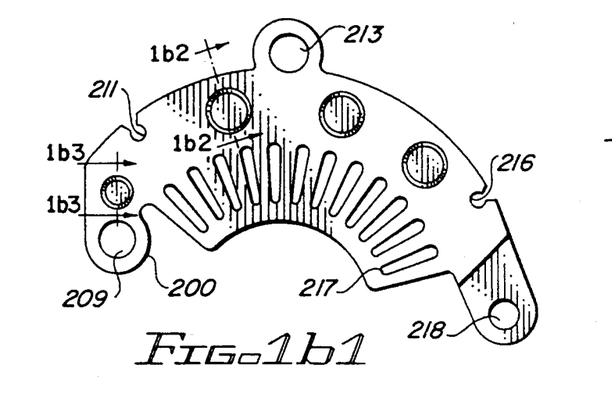
Figure 1B:
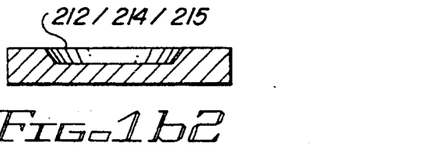
Figure 1B:
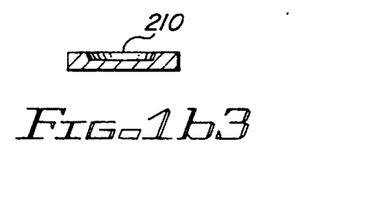

FIG. 1 depicts each of the components that constitute the rectifier assembly as the first embodiment of this invention. Each of the components are rotated 45 degrees toward the viewer from a plane projected at the eye level of the viewer. FIG. 1 depicts the following major sub-assemblies: preformed lead integument 100; insulated cooling member 200; capacitor 300; heat conducting insulator 400; and direct contact cooling member 500.

Figure 1C:
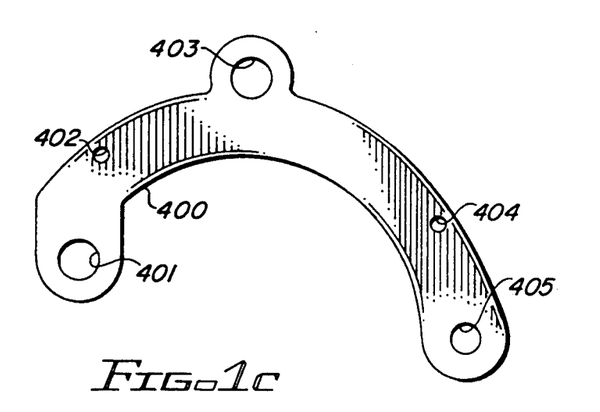
FIG. 1c is a plan view of the heat conductive electrical insulating gasket of FIG. 1.
Figure 1D:
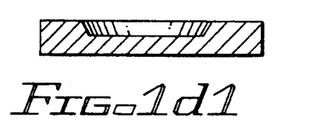
Figure 1D:
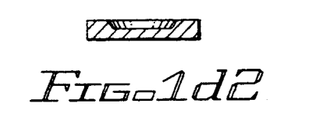
Figure 1D:
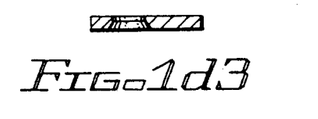
Figure 1D:
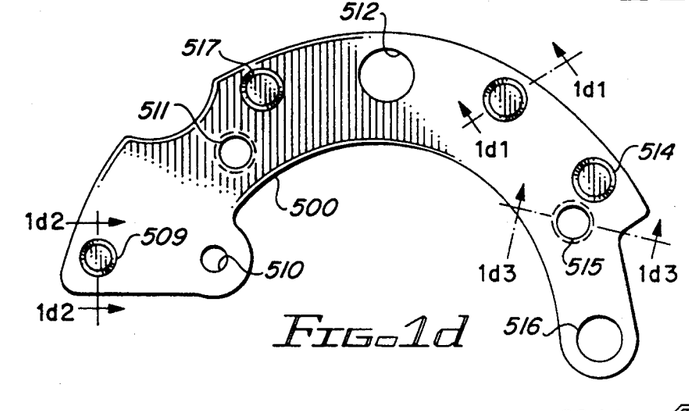

Numeral 500 refers to a direct contact cooling member which is also shown in plan view in FIG. 1d. Cooling member 500 is of either plated aluminum for solderabilty or copper construction, and is dimensioned for mounting in direct contact with a generator. Indentations 513, 514, 509, and the unmarked indentation under diode assembly 504 are impressed deep enough to provide horizontal placement of their respective components. Holes 511 and 515 are countersunk underneath so that rivets 507 and 508, once inserted in the holes, do not interfere with the flat surface under the cooling member 500. Holes 510 and 512 are clearance holes for the rectifier assembly to generator end frame attaching screws (not shown). Hole 516 is a clearance hole to permit non-conducting passage of an electrode bolt (not shown) which makes contact with insulated cooling member 200 and hole 218.

Figures 1E, 2B, 2C:
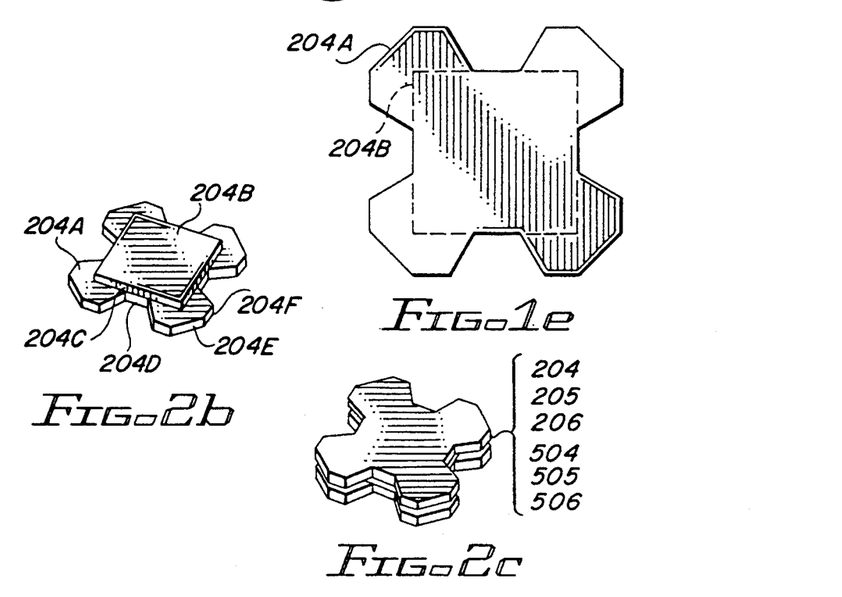
FIG. 1e is a plan view of the four-leaf clover shaped diode header assembly of FIG. 1.
FIGS. 2a to 2c are three-dimensional views depicting the assembly of the four-leaf clover shaped diode header assembly.
Figure 2A:
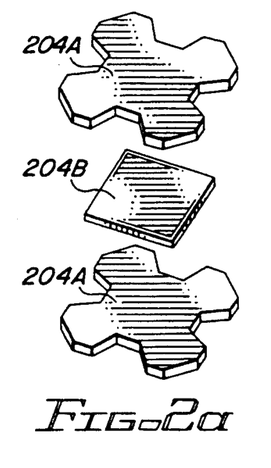

FIG. 2 depicts the assembly steps for one of the diode-clover shaped header assemblies 504, and FIG. 1e is the plan view of the clover shaped header 204A with the diode chip 204B shown in outline as a dotted line. Diode chip 204B, characterized by specified impurity doping, is cut to precise dimensions, is metalized, pretinned, and passivated. The lower diode header 204A (FIG. 2) of nickel plated copper construction is dropped into a corresponding fixture 204F that has four tines 204T that mate with the four inner surfaces 204I of 204D. The tines 204T are tapered to redirect the header 204A to rest in a repeatable position in the fixture 204F. In sequence, a solder preform is followed by diode chip 204B, is followed by a second solder preform and is followed by a cloverleaf top header 204A into the fixture. Slight pressure is exerted on the assembly 504, and the assembly is held together by the adhesive property of the solder preform and is ejected from the tinned fixture and passed into a reflow oven. In this manner, the diode assembly 504 consisting of two identical headers 204A, and a diode chip 204B both of FIG. 2 is assembled in a fast and repeatable fashion. It will be appreciated that the outer surfaces 204S of the headers 204A are dimensioned to snugly fit within the holes 512 and 514.

Extruded insulated cooling member 200 of FIG. 1 is shown in plan view in FIG. 1b is fabricated with similar indentations 210, 212, 214, and 215 to provide repeatable horizontal placement of respective diode assemblies 204, 205, and 206 and capacitor terminal 302. Cooling member 200 is extruded aluminum cut to a predetermined thickness, notch by hole 218 is machined to a predetermined thickness and completed insulated cooling member 200 is electroplated with a solderable metal.

Figures 7, 8:
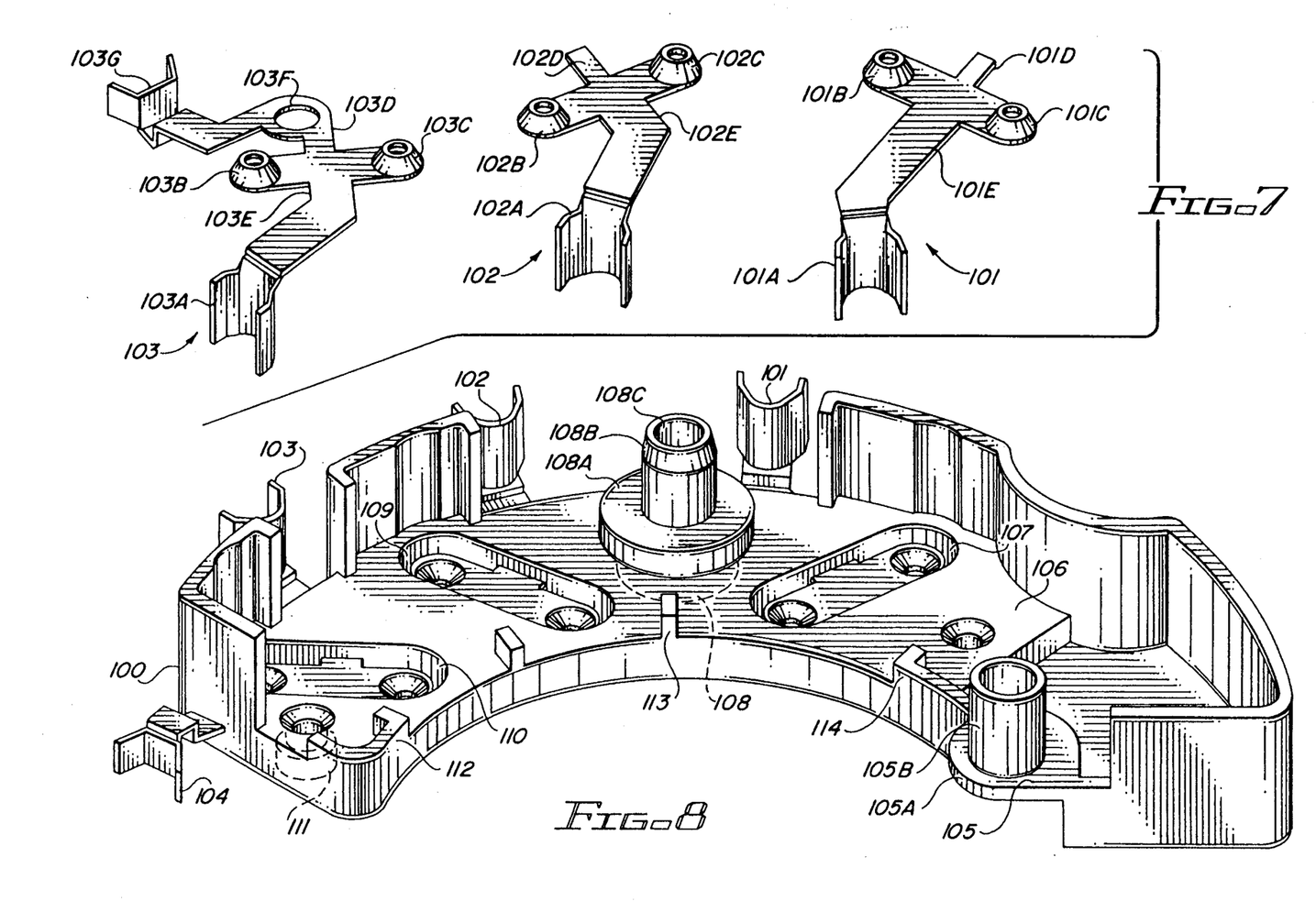
FIG. 7 is a three-dimensional view of the preformed leads before placement into the integument.
FIG. 8 is a three-dimensional view of the integrated preformed lead integument rotated 180 degrees from the viewing plane of FIG. 1.

Integral preformed lead integument 100 of FIG. 1 is shown in plan view in FIG. 1a and is moreover shown in an inverted position in the three-dimensional view in FIG. 8, with preformed leads shown in proper orientation independent of the integument in FIG. 7. Compound holes 106 and 110 of FIG. 1, which are detailed in Detail "B" of FIG. 1a, are made to attach to rivets 507 and 508. Preformed leads 101, 102, and 103 are of half-hard copper construction and molded into the integument 100 in the fabrication process.

Referring to FIG. 7, crimp ends 103, 102, and 101 provide a means to connect to the generator stator leads (not shown). The height of the crimp ends 103, 102 and 101 is made taller so that the stator leads can be cut off an original defective rectifier, leaving ample contact area for a replacement rectifier assembly.

With continued reference to FIG. 7, in the molding process, sections 101D, 101E, 102D 102E, 103D, and 101E are anchored firmly into the integument. In this manner, terminal ends 101B, 101C, 102B, 102C, 103B, and 103C are free to flex to provide thermal and mechanical stress relief. The terminal ends are also formed in a domed shaped configuration with a punched hole in the center of each dome to guide the passage of diode terminals 501, 502, 503, 201, 202, and 203 of FIG. 1. Crimp end 103G provides passage of stator crimp 103A to external circuitry (not shown). Protrusions 108B and 105B of integument 100 of FIG. 8 provide an insulated attaching member that fits through holes 213 and 209 of the insulated cooling member 200 of FIG. 1. The protrusion 108B is detailed in Detail "A" of FIG. 1a.

Figure 3:
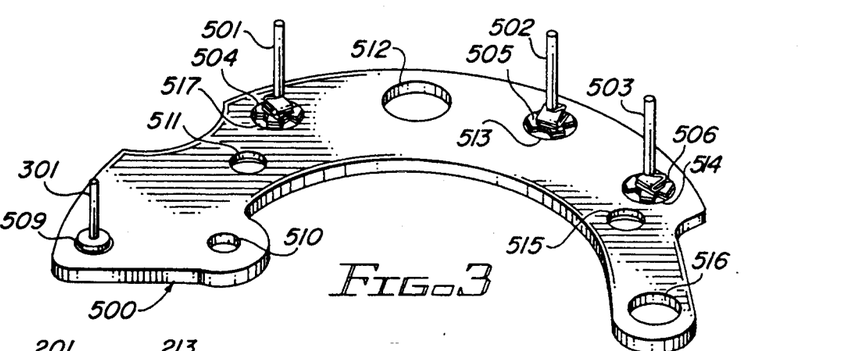
FIG. 3 is a three-dimensional view of the direct contacting cooling member assembly of FIG. 1.

FIG. 3 depicts the completed direct contacting cooling member sub-assembly 500. Solder preforms (not shown) of predetermined size are placed into indentations 509, 517, 513, and 514, and then the diode assemblies 504, 505, 506, and capacitor terminal 509 are placed respectively unto the solder preforms. The diode assemblies 504–506 are tested for polarity and then inverted if necessary before located above respective solder preforms. The diode assemblies and the capacitor terminal 301 are placed over the solder preforms with a predetermined amount of pressure to compress the solder preform in such a manner to be adhered to the cooling member. In orderly progression, each diode assembly 504–506 has a second solder preform of predetermined size centered, whereby the diode terminals 501, 502, and 503 are pressed on in a similar fashion and held reasonably secure by the compressed solder preform. The completed sub-assembly 500 is then passed through a time and temperature controlled oven to reflow the preforms in such a manner as to provide an electrically and mechanically sound assembly. Thereafter, each diode assembly-lower diode terminal unit 500 is sealed with a silicon based substance for addition protection. Each diode terminal 501–503 has the magnified configuration clearly shown on the right-hand side of FIG. 3, whereby the diode assembly connecting point is of a "S" shaped configuration for additional mechanical and thermal stress relief.

Figure 4:
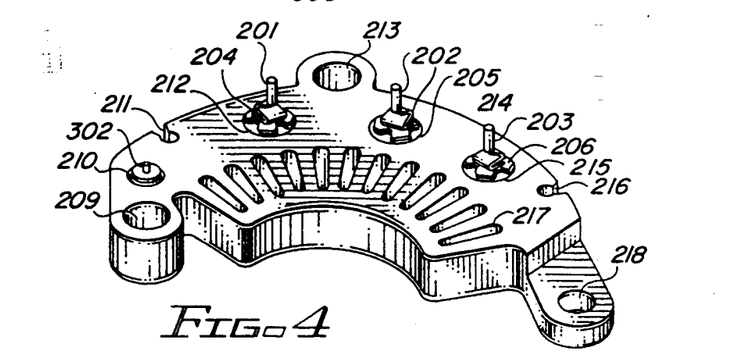
FIG. 4 is a three-dimensional view of the insulated cooling member sub-assembly of FIG. 1.

FIG. 4 details the sub-assembly 200 of the insulated cooling member, with procedure of manufacturing being identical as that of the direct contacting cooling member explained with reference to FIG. 3 above.

Figure 5:
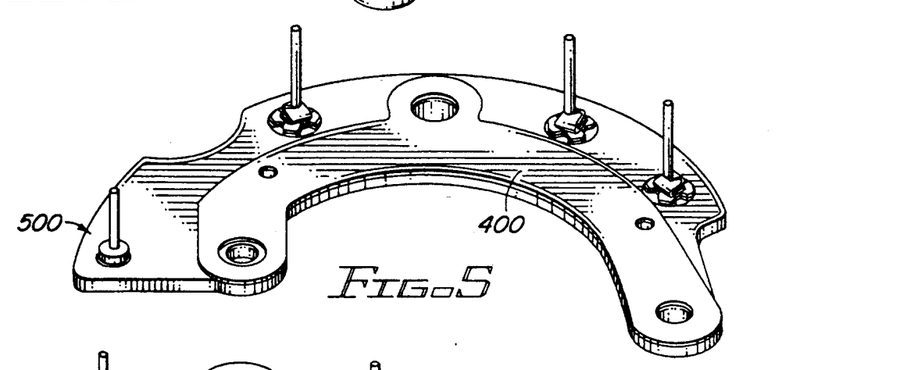
FIG. 5 is a three-dimensional view showing the placement of the gasket unto the direct cooling member sub-assembly in the first embodiment.

FIG. 5 depicts the direct cooling member assembly 500 of FIG. 3 with heat conducting insulator 400 in proper position. The insulator 400 of FIG. 5 is shown retrospective in FIG. 1 and in plan view in FIG. 1c. Holes 402 and 404 permit passage of rivets 507 and 508. Holes 401 and 403 permit passage of the protrusions 105B and 108B of the integument, as previously explained. Hole 405 is made smaller than aligned hole 516 of the direct contacting cooling member, to prevent contact of an insulated cooling member electrode screw (not shown) positioned into hole 218 of the cooling member, hence into hole 405 of the insulator, and thereafter, through hole 516 where the hole 516 does not contact the electrode screw. The insulator 400 is coated on each side with a thermal conductive compound to further aid in heat transfer before it is positioned on direct cooling member 500 as shown in FIG. 5.

Figure 6:
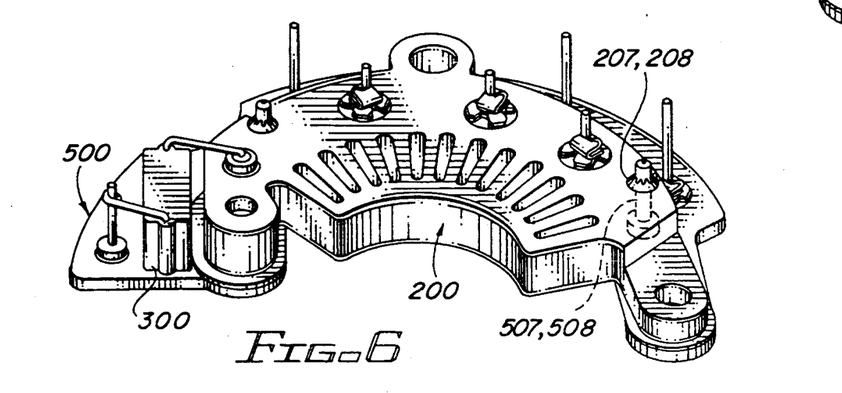
FIG. 6 is a three-dimensional view showing placement of the insulated cooling member sub-assembly onto the gasket-direct cooling member sub-assembly in the first embodiment.

FIG. 6 shows the placement of the insulated cooling member of FIG. 4 onto the direct cooling member-insulator of FIG. 5. Pushnuts 207 and 208 are pressed onto respective rivets 507 and 508 to unitize the sub-assembly. Capacitor 300 is then wired onto capacitor terminals 301 and 302 of FIG. 1 and soldered by conventional means.

Figure 9:
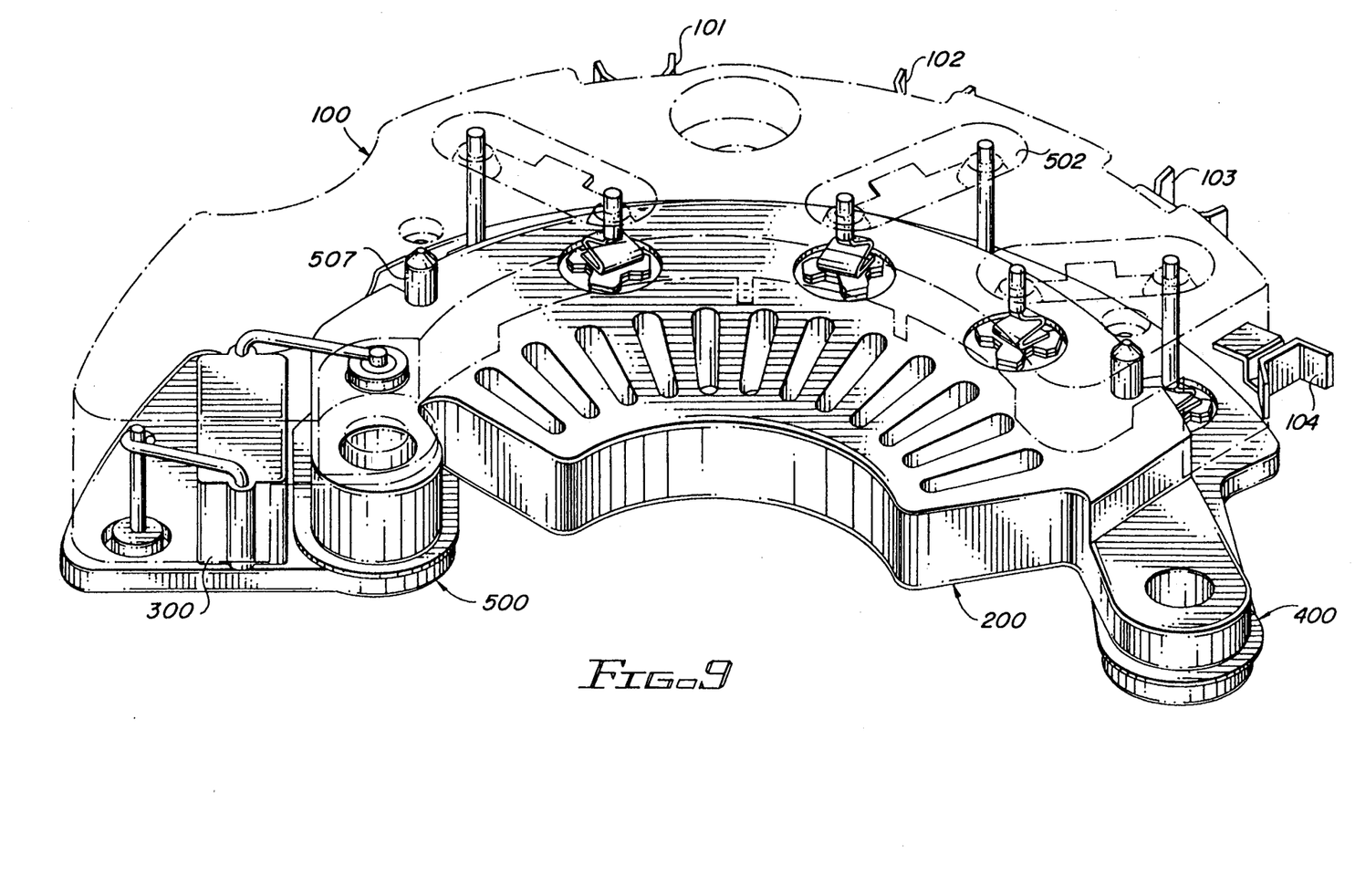
FIG. 9 is a three-dimensional partial x-ray assembled view of the components of FIG. 1.

FIG. 9 depicts in an "x-ray" format the completed rectifier assembly, where all of the components of FIG. 1 are shown in proper position. As a concluding assembly operation, diode terminals 201, 202, 203, 501, 502, and 503 of FIG. 1 are soldered to the domes of preformed leads 101B, 101C, 102B, 102C, 103B, and 103C by conventional means. Thereafter, each rectifier assembly as shown in FIG. 9 undergoes a series of quality and electrical checks, and then individually packaged for shipment.

FIGS. 10 through 15 depict the second embodiment of this invention as previously explained above, and uses like reference numerals followed by a "prime" symbol to indicate a corresponding assembly component or feature. For example, in FIGS. 1–9, numeral 500 refers to the cooling member, and in FIGS. 10–15, numeral 500' refers to the cooling member. FIGS. 10–15 thus complement FIGS. 1–9.

Figure 10:
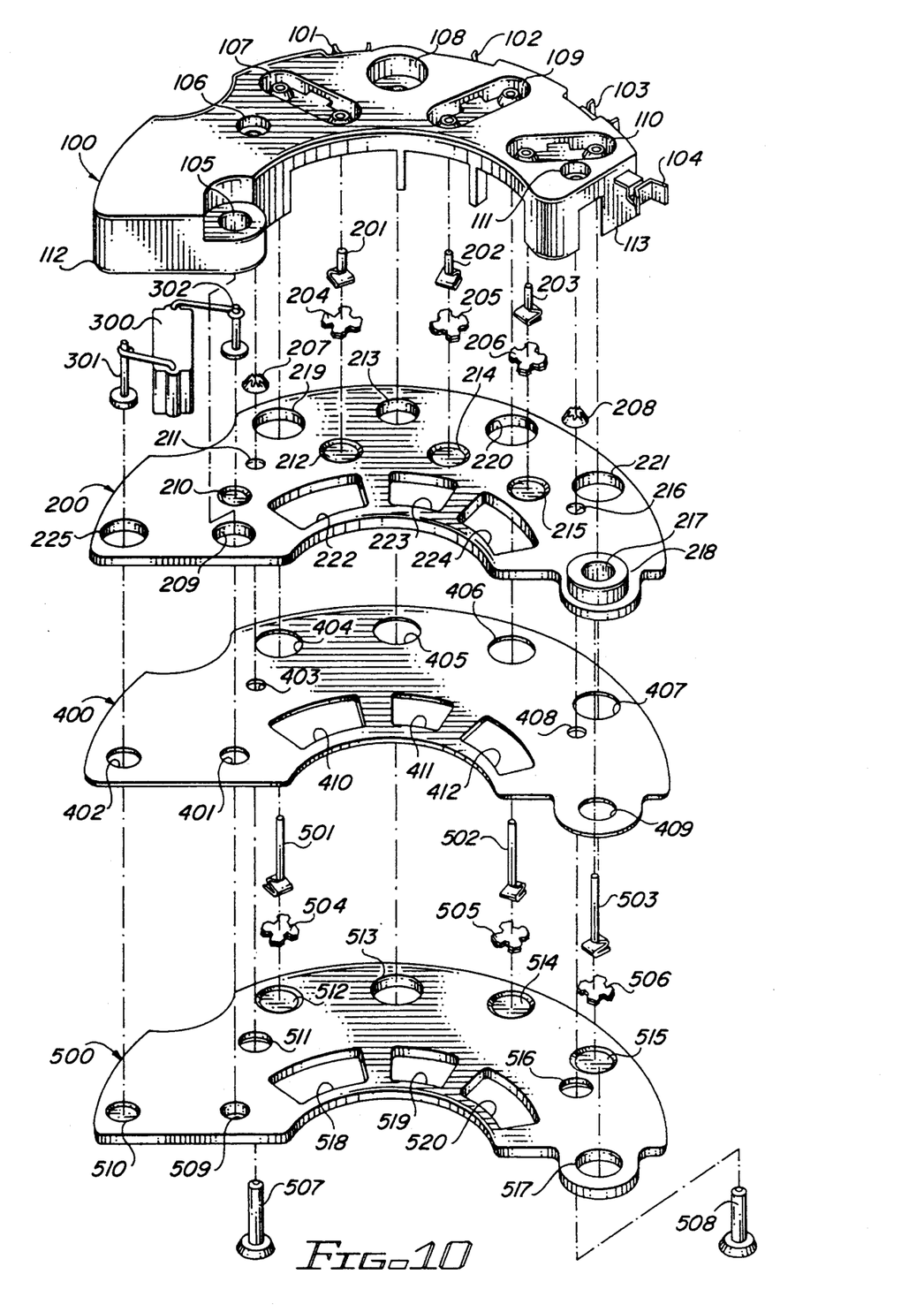
FIG. 10 is an exploded three-dimensional view depicting each of the components constituting the rectifier assembly in the second embodiment.
Figure 10A:
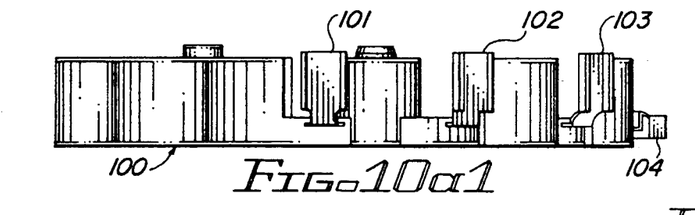
Figure 10A:
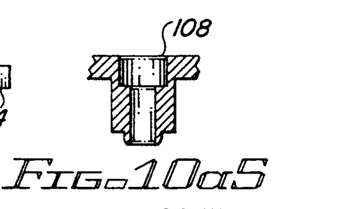
Figure 10A:
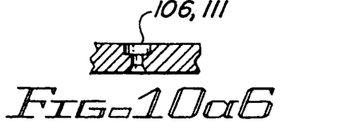
Figure 10A:
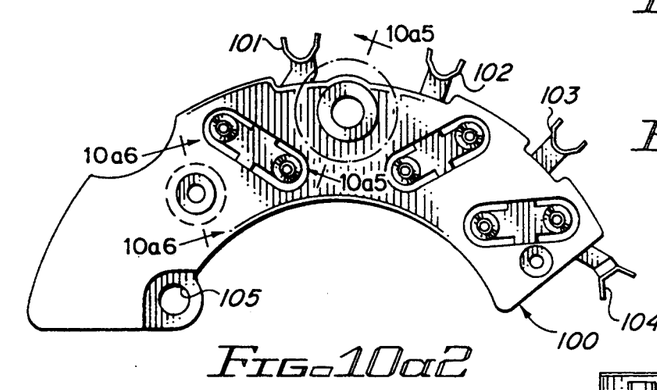
Figure 10A:
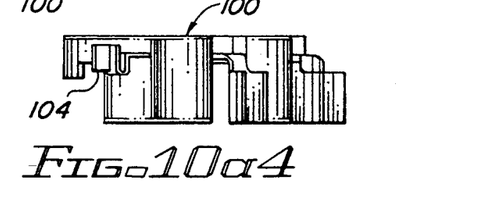
Figure 10A:
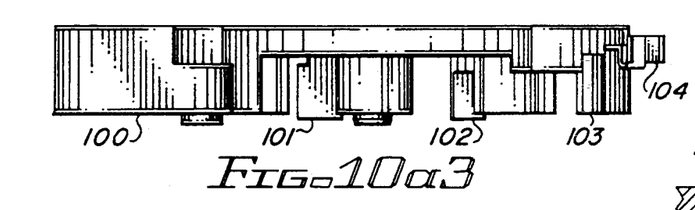
Figure 10B:
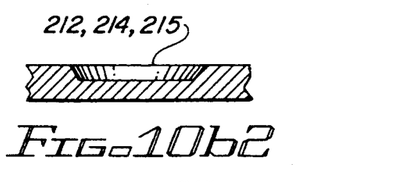
Figure 10B:
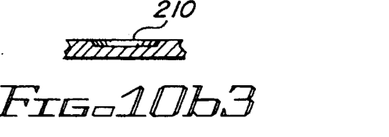
Figure 10B:
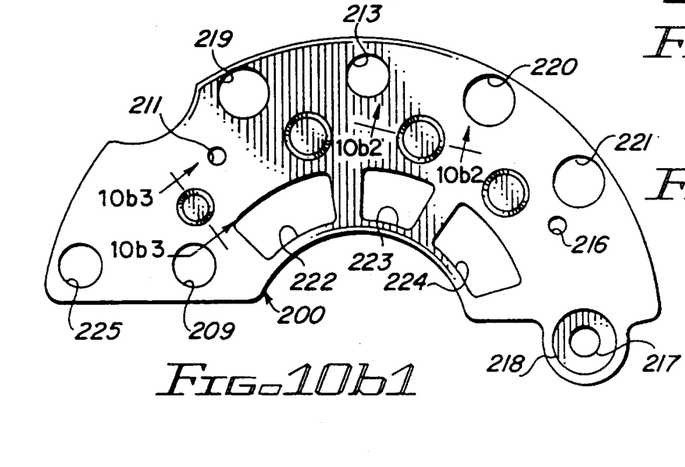

As to direct contact cooling member 500' of FIG. 10, it will be noted that indentations for diode assemblies and a capacitor terminal in addition to the two countersunk rivet holes share the same geometric positions in each of the cooling members 500 and 500'. However, cooling member 500' of FIG. 10 is expanded in its lateral dimension relative to cooling member 500 by the addition of an extended area 500A' to maximize the contact area with the generator end frame. Area 500A includes arc segment apertures 518', 519', and 520' which correspond to and are dimensioned to overlie similar segments located in the generator end frame when the assembly 500 is installed.

Figure 10C:
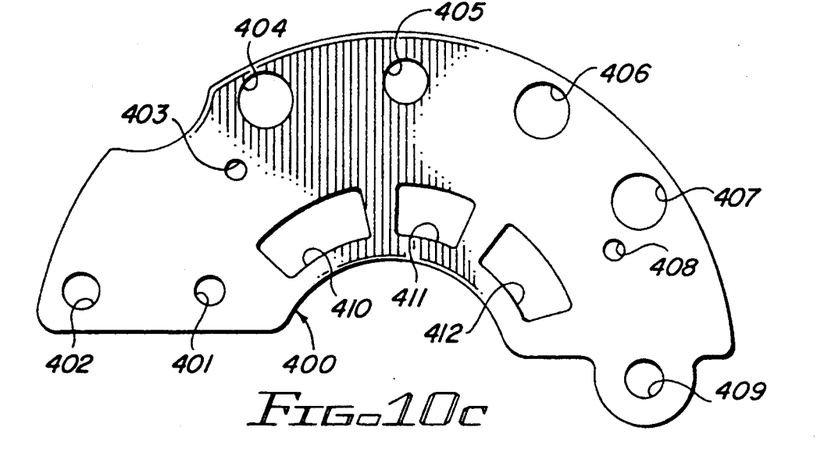
FIG. 10c is a plan view of the heat conductive electrical insulating gasket of FIG. 10.
Figure 10D:
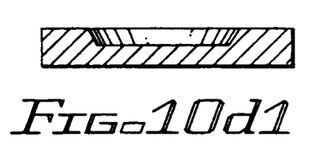
Figure 10D:
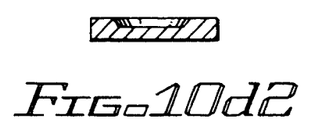
Figure 10D:
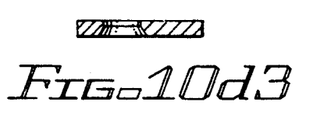
Figure 10D:
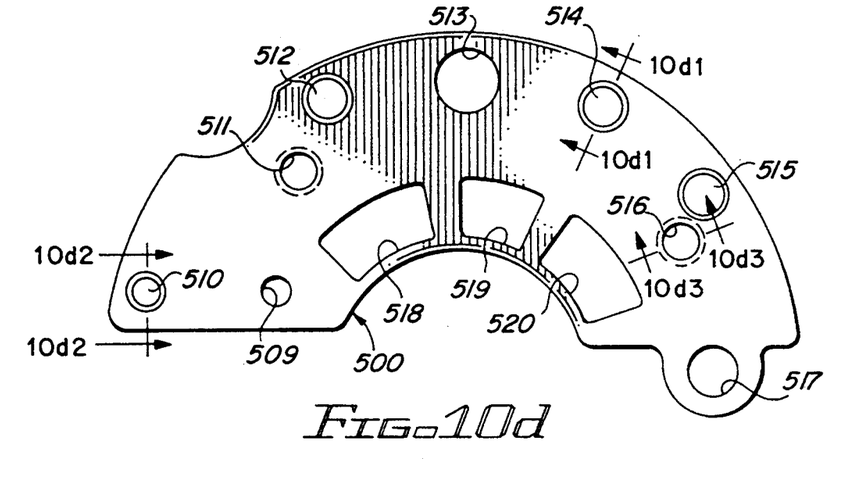

FIG. 10d is a plan view of the cooling member 500' of FIG. 10. The area of the cooling member 500' with the addition of area 500A' is approximately 25% greater than the similar cooling member 500 of FIG. 1. In this manner, each square unit of the cooling member 500 is expected to transfer 20% less of the heat of an equivalent cooling member.

Figure 11:
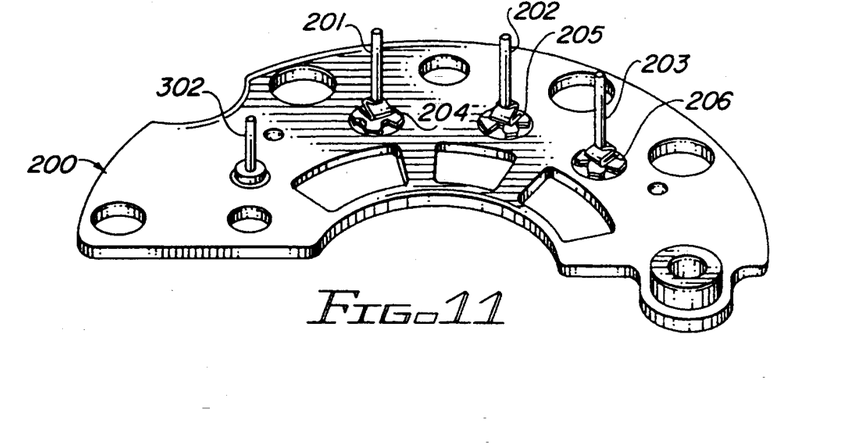
FIG. 11 is a three-dimensional view of the direct contacting cooling member assembly of FIG. 10.

FIG. 11 depicts the completed direct cooling member sub-assembly 500' whereby the assembly is essentially identical after completion as explained under FIG. 3.

Insulator 400' of FIG. 10 complements the insulator 400 of FIG. 1 with added diode assembly and capacitor terminal clearance holes 404', 405', 406', and 402' in addition to arc segment apertures 410', 411', and 412' in extended area 400A'. Insulator 400' of FIG. 10 is shown in plan view in FIG. 10c and sandwiched between the insulated and direct cooling members in FIG. 13.

Insulated cooling member 200' of FIG. 10 is similar in function to the insulated cooling member 200 of FIG. 1, except that it is not dependent on convection cooling. FIG. 10b is a plan view of the insulated cooling member 200', which can either be fabricated of copper or plated aluminum and includes extended area 200A'. Direct cooling member diode assemblies and capacitor clearance holes are added to the insulated member 200' at locations 219', 220', 221', and 225'. Arc segment ventilation apertures in line with the insulator, direct cooling member, and the generator end frame are located at 222', 223', and 224'. Washer 218' is added in line with electrode hole 217' to maintain the same thickness as the similar hole of complementary cooling member 200 of FIG. 1.

FIG. 11 depicts the insulated cooling member sub-assembly which share an identical assembly process as explained under FIG. 4 above.

Figure 12:
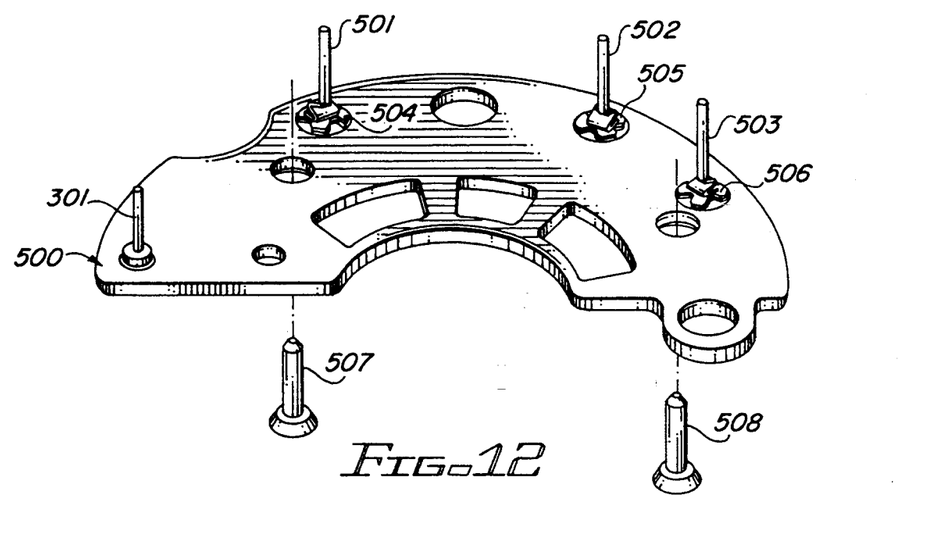
FIG. 12 is a three-dimensional view of the insulated cooling member sub-assembly of FIG. 10.
Figure 13:
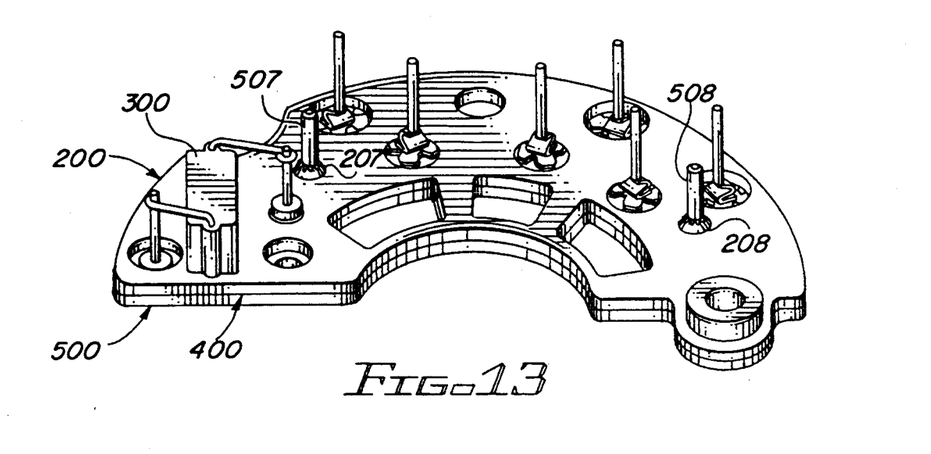
FIG. 13 is a three-dimensional view showing placement of the insulated cooling member sub-assembly of the second embodiment on the direct cooling member sub-assembly with the gasket sandwiched between the two.

FIG. 13 depicts the joining of the insulated and direct cooling members of FIGS. 11 and 12, which is assembled identically as discussed above with reference to FIG. 6.

Figure 14:
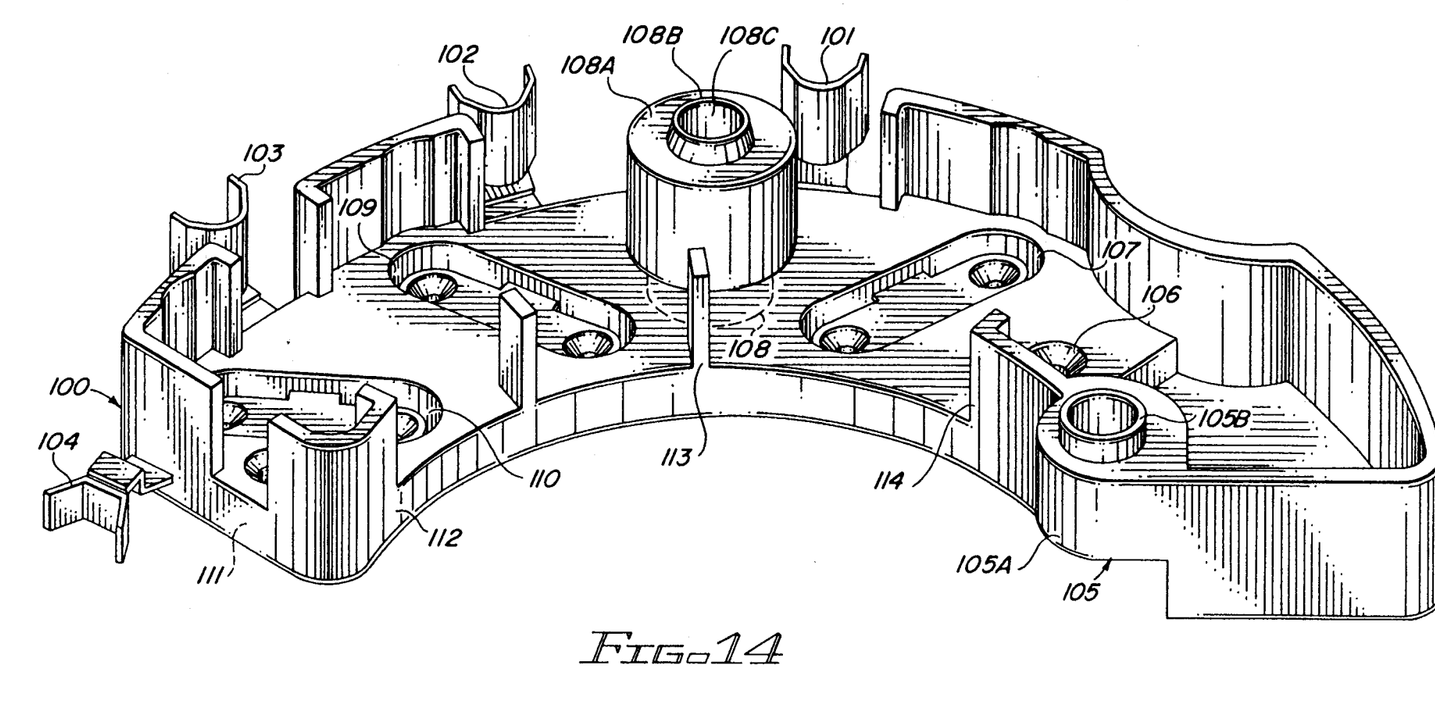
FIG. 14 is a three-dimensional view of the integrated preformed lead integument rotated 180 degrees from the viewing plane of FIG. 10.

FIG. 14 shares the same preformed leads of FIG. 7, and is identical in attachment and function to complement the integral preformed lead integument shown in FIG. 8. FIG. 10a is a plan view of the integument depicting the variations to maintain the same overall outline as the integument in FIG. 1a.

Figure 15:
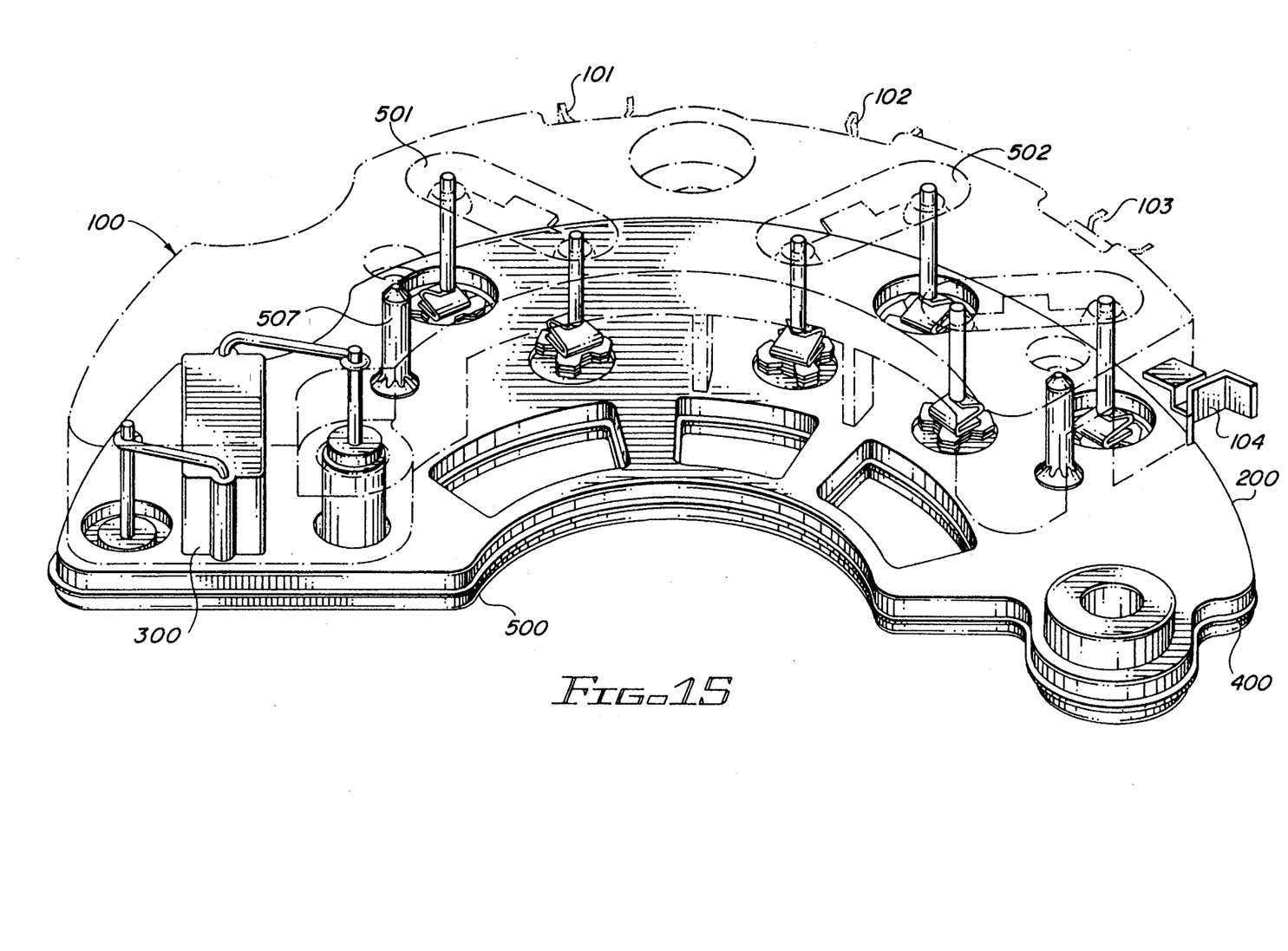
FIG. 15 is a three-dimensional partial x-ray assembled view of the components of FIG. 10.

FIG. 15 shows a partial "x-ray view" of the completed rectifier assembly of the second embodiment.

It will be noted that both FIGS. 9 and 15 depict a rectifier assembly that is interchangeable; however, the rectifier assembly of FIG. 15 has a greater ability to transfer a far greater portion of the diode-generated heat to the direct cooling member and sequentially to the end frame. The arc segment apertures are far less susceptible to blockage or environmental paraphernalia that occurs naturally due to the far greater area of the segments. Furthermore, the increased area of the arc segment apertures permits a far greater flow of the cooling medium.

When the second embodiment of this invention is used with the voltage regulator disclosed in co-pending Application Ser. No. 07/881,850 now U.S. Pat. No. 5,298,851 issued Mar. 29, 1994 to DeNardis (which is incorporated herein by reference), the voltage regulator shares a common end frame with the rectifier assembly. Since the voltage regulator consists of a common diode thermal shut-down circuit, then the rectifier assembly of this invention will transfer a far greater percentage of heat to the generator end frame. The voltage regulator will also shut down the generator by interrupting the flow of field current, and the voltage regulator will then activate a warning lamp to indicate to the vehicle operator that a malfunction has occurred. This permits the rectifier assembly to cool before permanent destruction occurs. If the operator is instructed to check for a generator ventilation blockage, the blockage results in a minor inconvenience as opposed to prior art rectifier assemblies, where a blockage often causes permanent damage to the rectifier assembly.

It is moreover evident to those skilled in the art, that the limit of current output is dependent on not exceeding a predetermined diode junction temperature, and is as such that if means were taken to remove the diode self-generated heat in a more efficient manner, that the diode assembly would be capable of outputting a greater current in a similar size package, such is the case of the second embodiment of FIGS. 10-15.

This concludes the description of the preferred embodiments. A reading by those skilled in the art will bring to mind various changes without departing from the spirit and scope of this invention. It is intended, however, that the invention only be limited by the following appended claims.

What is claimed is:

1. A rectifier assembly for use with an engine-driven generator, the rectifier assembly comprising:
    a first electrically conductive cooling member having a first surface for direct contact mounting on the generator, and a second surface with predetermined diode sub-assembly mounting locations along the second surface;
    a first set of diode sub-assemblies, each diode in the first sub-assembly fitted in one of the locations on the second surface of the first cooling member, each diode sub-assembly having a terminal extending generally normal from the first surface;
    an electrical insulator overlying the second surface of the first cooling member;
    a second electrically conductive cooling member having a first surface overlying the insulator and a second surface having predetermined locations for a second set of diode subassemblies;
    a second set of diode sub-assemblies, each sub-assembly of the second set fitted at one of the locations on the second surface of the second cooling member, each diode sub-assembly of the second set having a terminal extending generally normal from the second surface of the second cooling member;
    a lead integument of an electrically insulating material fitted over and about the second cooling member, the lead integument having conductive lead frames embedded therein, each lead frame interconnecting a diode sub-assembly of the first and second sets and having a terminal for interconnecting with a corresponding lead of a vehicle; and
    means for fitting and retaining the cooling members, the insulator and the lead integument together.

2. The rectifier assembly recited in claim 1 wherein each diode sub-assembly comprises:
    a pair of opposing headers of a conductive material, each header having two or more peripheral fixture surfaces corresponding to the dimensions of a manufacturing fixture and a peripheral shape and dimension adapted to fit within one of the locations on the second surface of the first and second cooling members; and
    a diode chip between and in electrical contact with the headers.

3. The rectifier assembly recited in claim 1 wherein the predetermined locations on the second surface of the first and second cooling member comprise indentations in the respective surfaces.

4. The rectifier assembly recited in claim 1 wherein the lead integument finds an inner cavity over the first and second set of diode sub-assemblies, with the terminals of each diode sub-assembly extending through the cavity and into the corresponding lead frame.

5. The rectifier assembly recited in claim 4 wherein the lead integument comprises a plastic member premolded with the lead frames prior to assembly with the cooling members and the insulating member.

6. The rectifier assembly recited in claim 5 wherein the lead integument comprises a plastic shell including an outer shell portion having the lead frames embedded therein, the outer shell portion extending generally parallel with the surfaces of the cooling members and the insulator; and the lead integument further including a peripheral shell portion extending generally normal to the outer shell portion and toward and adjacent to the periphery of the first cooling member.

7. The rectifier assembly recited in claim 6 wherein the terminal of each lead frame is cantilevered away from the peripheral shell portion of the lead integument.

8. The rectifier assembly recited in claim 7 wherein the fitting and retaining means comprises the lead integument having pre-molded stand-offs extending through corresponding holes in the second cooling member.

9. The rectifier assembly recited in claim 1 wherein the insulator only overlaps a portion of the second surface of the first cooling member apart from the predetermined locations.

10. The rectifier assembly recited in claim 9 wherein the second cooling member overlies only the insulator.

11. The rectifier assembly recited in claim 1 wherein the insulator and the second cooling member include holes therein corresponding to the predetermined locations on the second surface of the first cooling member, whereby the terminals of the first set of diode sub-assemblies extend through the insulator and the second cooling member.

12. The rectifier assembly recited in claim 1 wherein the first cooling member comprises an extended area having apertures therein corresponding to apertures in the engine-driven generator.

13. The rectifier assembly recited in claim 12 wherein the insulator and the second cooling member have apertures therein corresponding and overlying the apertures in the first cooling member.

14. The rectifier assembly recited in claim 13 wherein the integument only overlies an area of the second cooling member apart from the apertures.

15. A rectifier assembly for use with an engine-driven generator, the rectifier assembly comprising:
   a first electrically conductive cooling member having a first surface for direct contact mounting with the engine-driven generator, the first cooling member having a second, internal surface opposing the first surface with predetermined indentations along the second surface;
   a first set of diode sub-assemblies, each fitted in one of the indentations on the second surface of the first cooling member and having a terminal extending generally normal from said second surface;
   a member of an electrically insulating material overlying a portion of the second surface of the first cooling member apart from the indentations;
   a second electrically conductive cooling member having a first surface overlying and in contact with the insulating member and having an opposing second surface with indentations at predetermined locations in said second surface;
   a second set of diode sub-assemblies, each fitted in one of the indentations on the second surface of the second cooling member, each diode sub-assembly of the second set having a terminal extending generally normal from the second surface of the second cooling member;
   an insulating lead integument fitted over and about the second cooling member, the lead integument having conductive lead frames embedded therein, each lead frame interconnecting a diode sub-assembly of the first and second sets and having a cantilever terminal for interconnection with a corresponding lead of a vehicle; and
   means for fitting and retaining the cooling members, the insulating member and the lead integument together.

16. A rectifier assembly for use with an engine driven generator having cooling apertures, the rectifier assembly comprising:
   a first electrically conductive cooling member having a first surface for direct electrical contact mounting with an engine-driven generator, the first cooling member having an area dimensioned to extend over apertures of the generator and the first cooling member having apertures therein corresponding to the apertures of the generator, the first cooling member further including a second, internal surface having predetermined locations for mounting of diode sub-assemblies;
   a first set of diode sub-assemblies, each fitted at one of the predetermined locations along the second surface of the first cooling member, each diode sub-assembly of the first set having a terminal extending generally normal from the second surface of the first cooling member; and
   an electrical insulator overlying the second surface of the first cooling member;
   a second cooling member having a first surface overlying the insulator and a second surface having predetermined locations for mounting a second set of diode sub-assemblies, the second cooling member including apertures corresponding to the apertures of the first cooling member;
   a second set of diode sub-assemblies, each fitted at one of the predetermined locations along the second surface of the second cooling member, each diode sub-assembly of the second set having a terminal extending generally normal from the first surface;
   an insulating lead integument fitted over and about the cooling member, the lead integument having conductive lead frames embedded therein, each lead frame interconnecting a diode sub-assembly of the first and second sets and having a terminal for interconnecting with a corresponding lead of a vehicle; and
   means for fitting and retaining the cooling members the insulator and the lead integument together.

17. The rectifier assembly useful with an engine-driven generator as recited in claim 16, wherein each of the diode sub-assemblies has a diode construction comprising:
   a pair of opposing headers of a conductive material, each header having two or more peripheral fixture surfaces corresponding to the dimensions of a manufacturing fixture and a peripheral shape and dimension adapted for fitting within a placement location in a rectifier assembly; and
   a diode chip between and in electrical contact with the headers.

18. The diode construction recited in claim 17 wherein each header includes at least two inner fixture surfaces and at least two outer surfaces corresponding to the placement location of the rectifier assembly.

19. The diode construction recited in claim 18 wherein each header has a generally cloverleaf configuration, with four inner fixture surfaces and four outer surfaces corresponding to the placement location of the rectifier assembly.

20. The diode construction recited in claim 19 wherein the diode chip has a peripheral shape and dimension to fit within a boundary defined by the four fixture surfaces.

21. The diode construction recited in claim 20 further comprising an upright diode terminal electrically joined to an outside surface of an upper one of the headers.

* * * * *